United States Patent [19]

Ward

[11] Patent Number: 4,631,399
[45] Date of Patent: Dec. 23, 1986

[54] MULTIPOSITION ROTARY SWITCH WITH PHOTOTRANSISTORS

[76] Inventor: Russell G. Ward, 2050 SW. 71st Ave., Portland, Oreg. 97225

[21] Appl. No.: 615,226

[22] Filed: May 30, 1984

[51] Int. Cl.⁴ .............................................. G01V 9/04
[52] U.S. Cl. ................................... 250/221; 250/227; 250/229
[58] Field of Search ................ 250/227, 231 SE, 229, 250/578, 221; 350/96.1; 200/11 TW, 61.02, DIG. 36

[56] References Cited

U.S. PATENT DOCUMENTS

| | | | |
|---|---|---|---|
| Re. 30,094 | 9/1979 | Beeck | 250/229 |
| 4,304,630 | 12/1981 | Tanner | 250/231 SE |
| 4,338,518 | 7/1982 | Brienza et al. | 250/231 SE |
| 4,342,909 | 8/1982 | Accatino | 250/231 SE |

Primary Examiner—David C. Nelms
Attorney, Agent, or Firm—James D. Givnan, Jr.

[57] ABSTRACT

A switch including a rotor within a housing with the housing including a circular array of phototransistors. The rotor includes light transmission means such as a fiber optic which transmits light from a centrally located diode to a selected phototransistor. Each phototransistor is in circuit with a power source and with an output lead. A detent retains the rotor against undesired movement.

9 Claims, 7 Drawing Figures

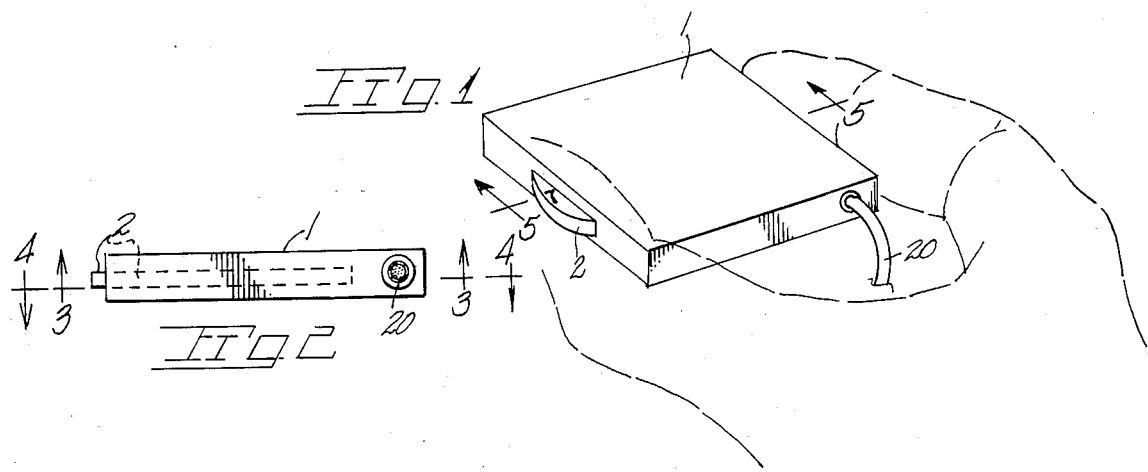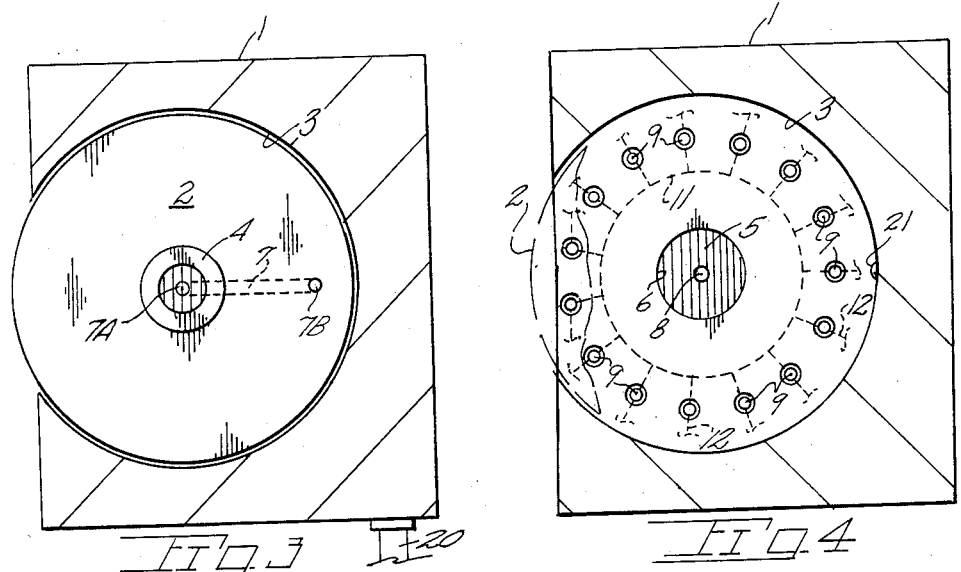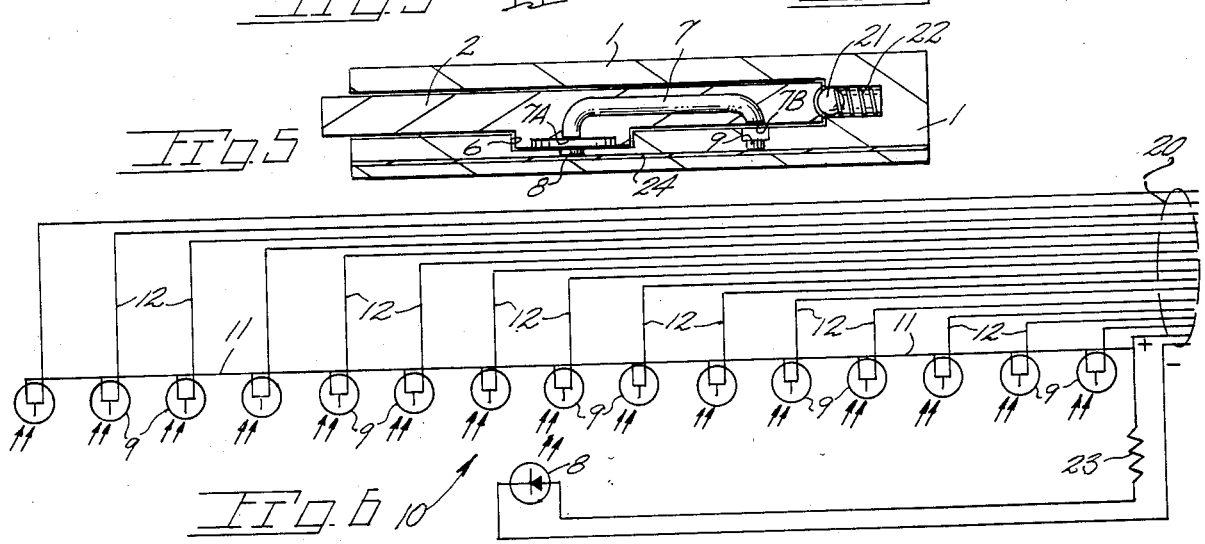

MULTIPOSITION ROTARY SWITCH WITH PHOTOTRANSISTORS

BACKGROUND OF THE INVENTION

The present invention pertains generally to that class of switches having a multitude of selectable positions.

The known prior art includes switches having a manually positioned wiper which carries a movable contact about or along a path comprising a number of stationary contacts. Switches having a wiper mechanically engaging contacts are subject to wear and to arcing to the extent that their use is problematic in many articles such as computors, radios, calculators, television, stereo systems, etc.

SUMMARY OF THE PRESENT INVENTION

The present invention is embodied in a switch having a light source and phototransistors to effect switch closing.

The switch includes a selector in a switch housing with the housing having an array of phototransistors proximate to which may be positioned the light emitting end of light transmission means such as a fiber optic. Light may be imparted to the fiber optic by a source such as a light emitting diode. Subjecting the phototransistors to light emitted from said transmission means causes same to conduct a current flow, for example, to a keyboard encoder or other component.

Important objectives include the provision of a switch of compact design yet having a multitude of circuit closing positions; the provision of a switch wherein a light source is utilized to energize a phototransistor to provide a current flow to an encoder or other component without current flow passing through a wiper or physical contact; the provision of a switch utilizing low cost electrical components having extremely long life to provide switch construction of low cost and high reliability.

BRIEF DESCRIPTION OF THE DRAWING

In the drawing:

FIG. 1 is a perspective view of the present switch held in the user's hand;

FIG. 2 is an end elevational view of said switch;

FIG. 3 is a horizontal sectional view thereof taken along line 3—3 of FIG. 2;

FIG. 4 is a horizontal sectional view taken downwardly along line 4—4 of FIG. 2;

FIG. 5 is a vertical sectional view taken along line 5—5 of FIG. 1;

FIG. 6 is a wiring schematic of the switch; and

FIG. 7 is a vertical sectional view of a modified switch rotor.

DETAILED DESCRIPTION OF THE PREFERRED EMBODIMENTS

With continuing attention to the drawings wherein applied reference numerals indicate parts similarly hereinafter identified, the reference numeral 1 indicates a switch housing which while shown individually may be integral with another structure.

A rotor 2 for manipulation by the user is retained within a housing open area 3. A suitable rotor bearing arrangement may include an annulus 4 journaled within a recess 5 defined by a circular wall 6 of the housing.

Rotor 2 carries light transmission means 7 which, in the preferred form, is a fiber optic having a light admitting end 7A and a light emitting end 7B. Light admitting end 7A of the fiber optic is coaxial with rotor 2 while light emitting end 7B is radially offset from the rotor axis.

Housing 1 serves to additionally mount a light emitting diode 8 and a circular array of phototransistors 9. The phototransistors 9 being equidistant from the rotor axis may be sequentially subjected to light originating at light emitting diode 8 and ultimately emitted by end 7B of the fiber optic.

Circuitry at 10 within housing 1 provides a common source 11 (FIG. 6) to an electrode of each phototransistor 9 while phototransistor output leads at 12 may be routed exteriorly via a cable 20 to a keyboard encoder 12 or other electrical component.

To facilitate switch operation the rotor may be acted upon by a detent 21 biased by a spring 22 into rotor engagement.

A modified rotor 2' is shown in FIG. 7 which rotor includes light transmission means 7' in the form of a prism having end located reflecting surfaces 7A'-7B' directing light from a light emitting diode 8' onto phototransistors at 9'. Other equivalent light transmission means may include mirrored surfaces on a still further modified rotor. While a light emitting diode is mentioned as a light source, it will be understood that other such light sources, such as a laser, may be suitable in certain applications.

In the wiring schematic of FIG. 6 a resistor is at 23.

The circular array of phototransistors 9 may be fabricated on a single substrate as at 24 of crystaline material such as silicon as an integrated circuit with connective wiring and electrodes being diffused directly onto a substrate wafer. Additionally, the centrally positioned light emitting diode may be fabricated directly into the same substrate. Housing 1 would thus serve as an enclosure for said substrate wafer, and leads connecting to the circuit electrodes would be routed through said enclosure.

While I have shown but a few embodiments of the invention it will be apparent to those skilled in the art that the invention may be embodied still otherwise without departing from the spirit and scope of the invention.

Having thus described the invention, what is desired to be secured under a Letters Patent is:

I claim:

1. A finger actuated switch comprising,
   a housing defining an open area,
   a light source in said housing in circuit with a power source,
   phototransistors in said housing and located adjacent said open area and each having an electrode in circuit with a power source,
   a manually positionable rotor in said housing open area and having an exposed surface for contact by the user's finger and including light transmission means for communicating light from said light source to one of said phototransistors and operable so as to selectively subject one of said phototransistors to light so as to perform a switching function, and
   said phototransistors each having a second electrode in circuit with a lead routed exteriorly of the housing.

2. The switch claimed in claim 1 wherein said light transmission means is a fiber optic.

3. The switch claimed in claim 1 wherein said light transmission means has reflective end surfaces.

4. The switch claimed in claim 1 wherein said light source is a light emitting diode disposed coaxially with the rotor axis of rotation.

5. The switch claimed in claim 1 additionally including detent means acting on said rotor to retain same in a set position.

6. The switch claimed in claim 1 wherein said phototransistors are integral with a substrate.

7. The switch claimed in claim 6 wherein the light source is also integral with said substrate.

8. The switch claimed in claim 1 wherein said phototransistors are disposed in a circular array.

9. The switch assembly claimed in claim 1 wherein said housing is of a size to be held between fingers of the user's hand.

* * * * *